United States Patent
Chen

(10) Patent No.: US 6,742,695 B2
(45) Date of Patent: Jun. 1, 2004

(54) SOLDERING MACHINE FOR TAPE CARRIER PACKAGE OUTER LEADS

(75) Inventor: Chun-Jung Chen, Pingtung (TW)

(73) Assignee: Hannstar Display Corporation, Taipei (TW)

( * ) Notice: Subject to any disclaimer, the term of this patent is extended or adjusted under 35 U.S.C. 154(b) by 29 days.

(21) Appl. No.: 09/930,802

(22) Filed: Aug. 14, 2001

(65) Prior Publication Data

US 2002/0158105 A1 Oct. 31, 2002

(30) Foreign Application Priority Data

Apr. 27, 2001 (TW) .......................................... 90206812

(51) Int. Cl.[7] .......................... B23K 37/02; B23K 37/04; B23K 37/00; B23K 31/00
(52) U.S. Cl. ...................... 228/45; 228/179.1; 228/102; 228/4.1; 228/49.5; 228/5.5
(58) Field of Search ........................ 228/45, 47.1, 49.5, 228/179.1, 4.1, 5.5, 102

(56) References Cited

U.S. PATENT DOCUMENTS

| | | | | | |
|---|---|---|---|---|---|
| 3,812,581 | A | * | 5/1974 | Larson et al. ................. | 29/854 |
| 3,997,100 | A | * | 12/1976 | Hofmeister ............... | 228/179.1 |
| 4,650,950 | A | * | 3/1987 | Hayakawa et al. ....... | 219/85.12 |
| 4,731,923 | A | * | 3/1988 | Yagi et al. ..................... | 29/833 |
| 5,297,718 | A | * | 3/1994 | Nagata ......................... | 228/102 |
| 6,131,795 | A | * | 10/2000 | Sato ............................ | 228/102 |
| 6,250,537 | B1 | * | 6/2001 | Avila et al. ............... | 228/179.1 |
| 6,454,155 | B1 | * | 9/2002 | Liu .............................. | 228/45 |

FOREIGN PATENT DOCUMENTS

| | | | |
|---|---|---|---|
| CH | 669884 A5 | * | 4/1989 |
| JP | 1291319 A | * | 2/1987 |

* cited by examiner

*Primary Examiner*—Tom Dunn
*Assistant Examiner*—L. Edmondson
(74) *Attorney, Agent, or Firm*—J.C. Patents

(57) ABSTRACT

A soldering machine for tape carrier package. The soldering machine includes a cylinder, a linking rod, a cushioning pad, a floating connector and a press head assembly. The cylinder has a first end and a second end. The linking rod passes through the interior of the cylinder. The linking rod also has a first end and a second end. The first end of the linking rod protrudes from the first end of the cylinder while the second end of the first linking rod protrudes from the second end of the cylinder. The first end of the linking rod has a threaded section with an adjusting nut screw onto the threaded section. There is a cushioning pad between the adjusting nut and the cylinder. The second end of the linking rod has a floating connector. The press head assembly and the linking rod is connected together via the floating connector.

5 Claims, 2 Drawing Sheets

SOLDERING MACHINE FOR TAPE CARRIER PACKAGE OUTER LEADS

CROSS-REFERENCE TO RELATED APPLICATION

This application claims the priority benefit of Taiwan application serial no. 90206812, filed Apr. 27, 2001.

BACKGROUND OF THE INVENTION

1. Field of Invention

The present invention relates to a soldering machine for bonding outer leads of a tape carrier package (TCP) to contact points of a printed circuit board. More particularly, the present invention relates to a soldering machine having a simple adjusting mechanism for bonding outer leads of tape carrier package to contact points of a printed circuit board.

2. Description of Related Art

To manufacture a tape carrier package (TCP), a tape carrier having a plurality of inner leads and outer leads is provided. The inner leads are electrically connected to the driver chip while the both ends of the outer leads are electrically connected respectively to a liquid crystal display (LCD) and a printed circuit board (PCB). As a result, the liquid crystal display can be electrically connected to the printed circuit board. To mount the outer leads onto the printed circuit board, first, a plurality of solder bumps are respectively formed on the outer leads, and then a soldering machine is used to press the outer leads, which thus the outer leads are bonded to the contact points of the printed circuit board by the solder bumps.

FIG. 1 is a sketch showing a conventional soldering machine for tape carrier package. As shown in FIG. 1, the soldering machine 100 includes a cylinder 110, a floating connector 120, a press head assembly 130, a platform 140 and a support plate 150. The platform 140 is fastened to the support plate 150 and the cylinder 110 is fastened on the platform 140. Through the floating connector 120, the press head assembly 130 is free to move up or down carrying out a pressing operation when driven by the cylinder 110. The soldering machine 100 is fixed onto a processing station (not shown) through the support plate 150. There is a press head 132 on the lower part of the press head assembly 130. By pressing the press head 132 on the outer leads (not shown) of a tape carrier (not shown), the outer leads are bonded to the contact points of the printed circuit board by the solder bumps.

In the aforementioned type of the soldering machine, adjustment of height d between the press head assembly 130 and a base 170 is achieved by turning a nut 160. Furthermore, the press height d and pressure exerted on the outer leads by the press head 132 can be fine-tuned through a micro-adjusting system 180. The micro-adjusting system 180 includes a fine adjustment nut 182, a spring 184, a linking rod 186, a fixed plate 188 and a threaded rod 190. The fixed plate 188 extends to the upper surface 112 of the cylinder 110. The threaded rod 190 passes through the fixed plate 188. The nut 182 screws in at one end of the threaded rod 190 while the other end passes out under the fixed plate 188. One end of the spring 184 is hooked to the other end of the threaded rod 190 underneath the fixed plate 188. The other end of the spring 184 is hooked onto one end of the linking rod 186 while the other end of the linking rod 186 is fastened to the top of the press head assembly 130. With this structure, press height d and pressure on the press head 132 can be minutely adjusted by turning the nut 182 to raise or lower the press head assembly 130 a little.

To adjust height d of the soldering machine, an operator needs to rotate the nut 160 located in the middle of the soldering machine 100. The operator must move a special open-end wrench skillfully from the left side of the support plate 150 to the position of the nut 160. Furthermore, the support plate 150 and the head assembly 130 restrict the angle of movement of the wrench. Hence, press adjustment not only requires a skillful technician but also demands considerable time. Moreover, the height d must be set anew for each type of product. Hence, productivity is lowered.

SUMMARY OF THE INVENTION

Accordingly, one object of the present invention is to provide a soldering machine for tape carrier package such that press adjustment is simplified and more space is set aside for press height adjustment. Ultimately, press position can be adjusted quickly and efficiently.

To achieve these and other advantages and in accordance with the purpose of the invention, as embodied and broadly described herein, the invention provides a soldering machine for tape carrier package. The soldering machine includes a cylinder, a first linking rod, a cushioning pad, a floating connector and a press head assembly. The cylinder has a first end and a second end. The first linking rod passes through the interior of the cylinder. The first linking rod also has a first end and a second end. The first end of the first linking rod protrudes from the first end of the cylinder while the second end of the first linking rod protrudes from the second end of the cylinder. The first end of the first linking rod has a threaded section with an adjusting nut screwed onto the threaded section. There is a cushioning pad between the adjusting nut and the cylinder. In addition, the second end of the first linking rod includes a floating connector. The press head assembly and the first linking rod are connected together via the floating connector.

According to one embodiment of this invention, the soldering machine for bonding tape carrier outer leads further includes a micro-adjusting system. The micro-adjusting system includes a fixed plate, a threaded rod, a micro-adjusting nut, a spring and a second linking rod. The fixed plate extends to the cylinder and fastens with the cylinder body. The threaded rod passes through the fixed plate. The threaded rod has a first end and a second end. The first end and the second end of the threaded rod protrude from the first side and the second side of the fixed plate. The micro-adjusting nut is screwed onto the first end of the threaded rod. The spring is hooked onto the second end of the threaded rod. The second linking rod has a first end and a second end. The other end of the spring is attached to the first end of the second linking rod while the other end of the second linking rod is fastened to the press head assembly.

In brief, one major aspect of this invention is a change in the press adjusting mechanism so that an operator can adjust height level of the press head assembly with ease.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
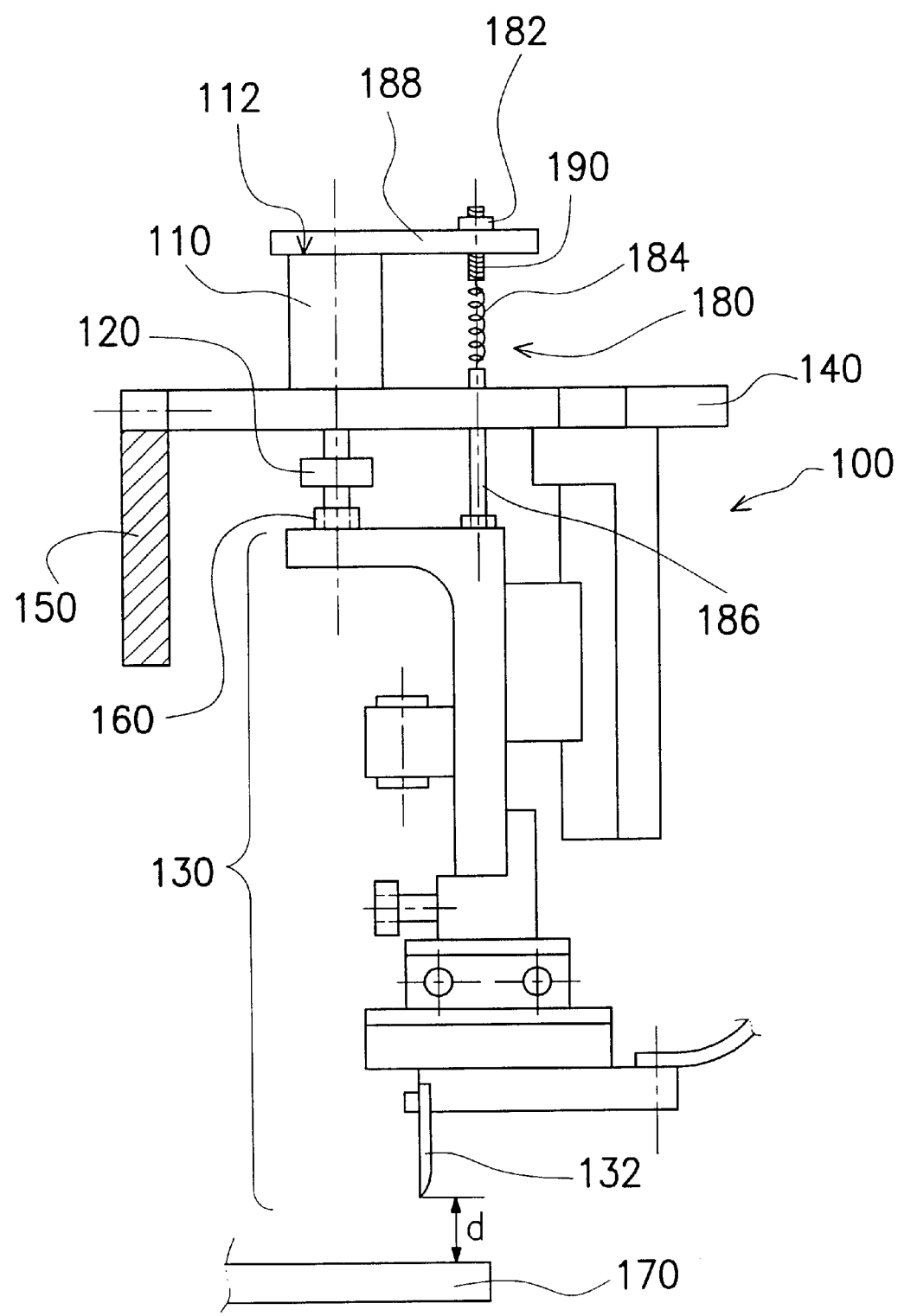
FIG. 1 is a sketch showing a conventional soldering machine for tape carrier package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
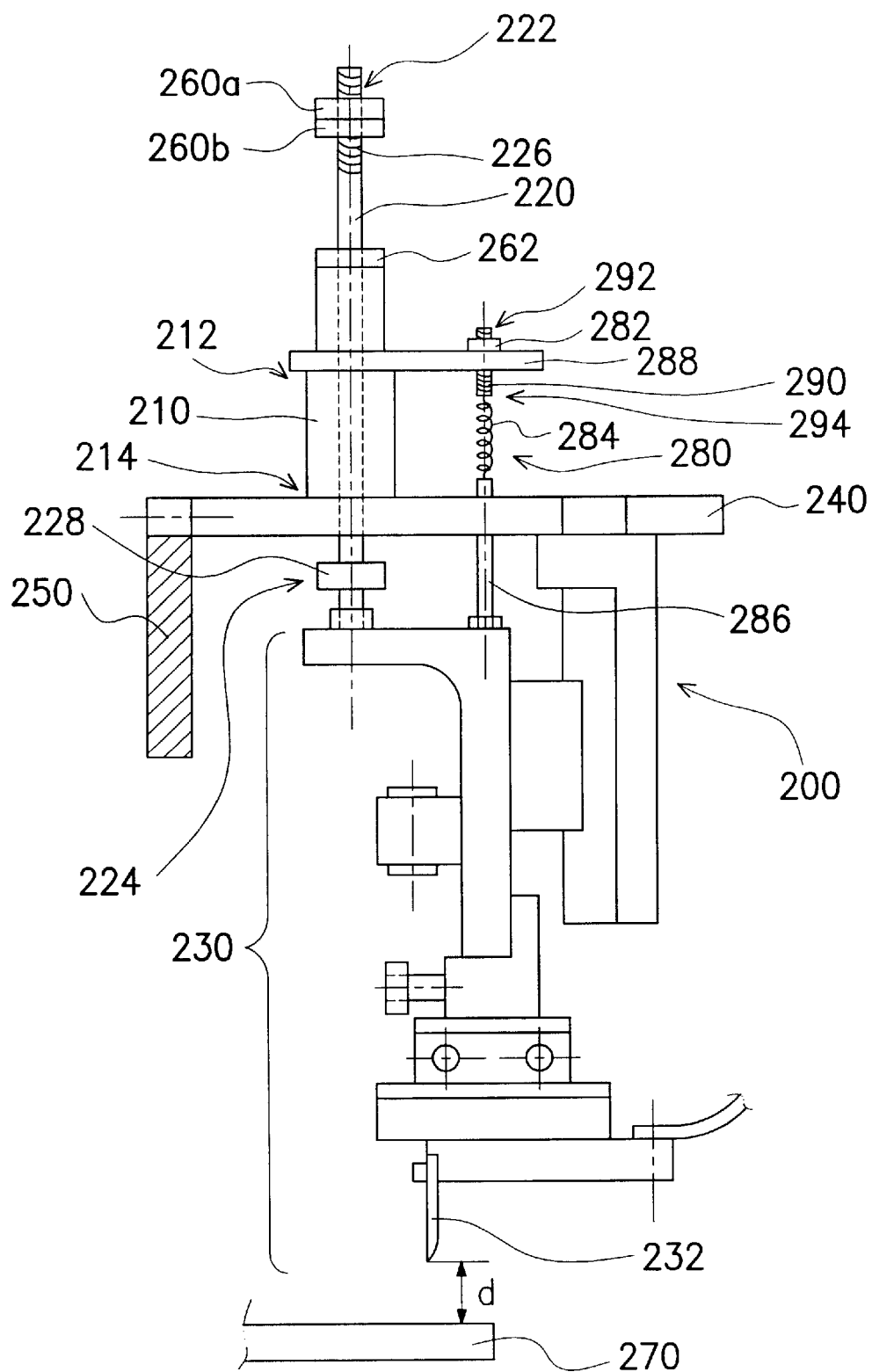
FIG. 2 is a sketch showing a soldering machine for tape carrier package according to one preferred embodiment of this invention.

FIG. 2 is a sketch showing a soldering machine for tape carrier package according to one preferred embodiment of this invention. As show in FIG. 2, the soldering machine 200 includes a cylinder 210, a linking rod 220, a press head assembly 230, a platform 240 and a support plate 250. The cylinder 210 is mounted on the platform 240. The cylinder 210 has a first end 212 and a second end 214. The linking rod 220 passes through the interior of the cylinder such that a first end 222 of the linking rod 220 protrudes from the first end 212 of the cylinder 210 for connecting with an adjusting assembly. The first end 222 of the linking rod 220 has a threaded section 226 and the adjusting assembly includes two adjusting nuts 260a and 260b. Both adjusting nuts 260a and 260b are screw onto the threaded section 226. A second end 224 of the linking rod 220 protrudes from the second end 214 of the cylinder 210. The second end 224 of the cylinder 210 includes a floating connector 228. The linking rod 220 connects with a press head assembly 230 via the floating connector 228. Through the support plate 250, the soldering machine 200 is fastened onto a processing machine (not shown). There is a press head 232 at the lower portion of the press head assembly 230. The press head 232 is a device for pressing the outer leads (not shown) of a tape carrier (not shown) and thus the outer leads can be bonded to the contact points of the printed circuit board by the solder bumps.

In the aforementioned soldering machine 200, range of movement of the linking rod 220 is adjusted by turning the nuts 260a and 260b. Turning the nuts 260a and 260b effectively increases or decreases distance d from the press head assembly 230 to the base 270. The nut 260a stacks on top of the nut 260b. When the linking rod 220 moves down, the press head assembly 230 follows so that the press height d is lowered correspondingly. The downward movement of the linking rod 220 stops as soon as the cushioning pad 262 touches the adjusting nut 260b. Any vibration due to the impact of the nut 260b onto the cushioning pad 262 is dampened by the cushioning pad 262. Once the outer leads of the tape carrier (not shown) is pressed to bond contact points of a printed circuit board (not shown) via the press head 232, the linking rod 220 moves up. The nut 260b separates from the cushioning pad 262 and stops only when the plunger (not shown) inside the cylinder 210 encounters a stopping point. Hence, the linking rod 220 can move up and down in repeated cycles. Since the nut 260b contacts the cushioning pad 262 in each cycle of the linking rod 220, the nut 260b on the linking rod 220 is likely to drift, leading to a drift in press height d with time. Hence, another adjusting nut 260a is added to form a pair that not only stops any drifting in press height d but also prevents any damages to the thread in the linking rod 220.

The soldering machine 200 further includes a micro-adjusting system 280 for fine adjustment of the press height d and setting the pressure exerted on the outer leads by the press head 232 accurately. The micro-adjusting system 280 includes a micro-adjustment nut 282, a spring 284, a linking rod 286, a fixed plate 288 and a threaded rod 290. The fixed plate 288 extends and fastens to the cylinder 210. The threaded rod 290 passes through the fixed plate 288. The threaded rod 290 has a first end 292 and a second end 294. The first end 292 and the second end 294 of the threaded rod 290 protrudes from the respective sides of the fixed plate 288. The micro-adjustment nut 282 is screwed onto the first end 292 of the threaded rod 290 such that the nut 282 is above the fixed plate 288. One end of the spring 284 is hooked onto the second end 294 of the threaded rod 290 under the fixed plate 288. The other end of the spring 284 is hooked onto one end of the linking rod 286. The other end of the linking rod 286 is fixed onto the press head assembly 230. Hence, press height d of the press head assembly 230 and pressure exerted by the press head 232 on the outer leads can be increased or decreased by rotating the micro-adjusting nut 282.

In the soldering machine 200, both the micro-adjusting nuts 260a and 260b are located in the upper section of the soldering machine 200. Hence, an operator turning the nuts 260a and 260b is permitted a greater range of spatial movement. Without any machine element blocking the movement of adjusting tools, adjustment of the press height d is easier and faster, leading to an increase in productivity.

In summary, this invention provides a soldering machine for tape carrier package such that the adjusting nuts are positioned in the upper section of the soldering machine. Hence, spatial movement by an operating tool is less restrictive. Ultimately, press height adjustment is shorter and easier.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A soldering machine comprising:
 a main-adjusting system, comprising:
  a cylinder having a first end and a second end;
  a first linking rod passing through an interior of the cylinder, wherein the first linking rod has a first end and a second end, the first end of the linking rod protrudes from the first end of the cylinder and the second end of the linking rod protrudes from the second end of the cylinder, and the first linking rod has a threaded section at the first end thereof and a floating connector at the second end thereof;
  an adjusting nut screwed onto the threaded section of the first linking rod;
  a cushioning pad between the adjusting nut and the cylinder; and
  a press head assembly connected to the floating connector of the first linking rod; and
 a micro-adjusting system, comprising:
  a fixed plate attached to the cylinder;
  a threaded rod passing through the fixed plate, wherein the threaded rod has a first end and a second end, and the first end and the second end of the threaded rod protrude from respective sides of the fixed plate;

a micro-adjusting nut screwed onto the first end of the threaded rod;

a spring with one end hooked onto the second end of the threaded rod; and a second linking rod having a first end and a second end, wherein the ohter end of the spring is hooked onto the first end of the second linking rod and the second end of the second linking rod is connected to the press head assembly.

2. A soldering machine comprising:

a main-adjusting system, comprising:
   a cylinder having a first end and a second end;
   a first linking rod passing through an interior of the cylinder, wherein the first linking rod has a first end and a second end, the first end protrudes from the first end of the cylinder and the second end protrudes from the second end of the cylinder;
   an adjusting element connected to the first end of the first linking rod; and
   a press head assembly connected to the second end of the first linking rod; and a micro-adjusting system, comprising:
   a fixed plate attached to the cylinder;
   a threaded rod passing through the fixed plate, wherein the threaded rod has a first end and a second end, and the first end and the second end of the threaded rod protrude from respective sides of the fixed plate;
   a micro-adjusting nut screwed onto the first end of the threaded rod;
   a spring with one end hooked onto the second end of the threaded rod; and
   a second linking rod having a first end and a second end, wherein the other end of the spring is hooked onto the first end of the second linking rod and the second end of the second linking rod is connected to the press head assembly.

3. The soldering machine of claim 2, wherein the first end of the first linking rod has a threaded section and the adjusting element includes at least an adjusting nut, and the adjusting nut is screwed onto the threaded section of the first linking rod.

4. The soldering machine of claim 2, wherein the soldering machine further includes a cushioning pad between the adjusting element and the cylinder.

5. The soldering machine of claim 2, wherein the soldering machine further includes a floating connector attached to the second end of the first linking rod for connecting with press head assembly.

* * * * *